(12) United States Patent
Yen et al.

(10) Patent No.: US 10,068,896 B1
(45) Date of Patent: Sep. 4, 2018

(54) ELECTROSTATIC DISCHARGE PROTECTION DEVICE AND MANUFACTURING METHOD THEREOF

(71) Applicant: UNITED MICROELECTRONICS CORP., Hsin-Chu (TW)

(72) Inventors: Shih-Che Yen, Taoyuan (TW); Po-Ya Lai, Changhua County (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/445,999

(22) Filed: Mar. 1, 2017

(51) Int. Cl.
| | |
|---|---|
| *H01L 29/06* | (2006.01) |
| *H01L 27/02* | (2006.01) |
| *H01L 29/10* | (2006.01) |
| *H01L 29/08* | (2006.01) |
| *H01L 29/749* | (2006.01) |
| *H01L 29/66* | (2006.01) |

(52) U.S. Cl.
CPC ........ *H01L 27/027* (2013.01); *H01L 29/0653* (2013.01); *H01L 29/0847* (2013.01); *H01L 29/1095* (2013.01); *H01L 29/66356* (2013.01); *H01L 29/749* (2013.01)

(58) Field of Classification Search
CPC ..... H01L 29/06; H01L 29/08; H01L 29/0653; H01L 29/0843; H01L 27/0248; H01L 27/0292; H01L 27/0251; H01L 27/0255; H01L 27/0259; H01L 27/0266
USPC ......................................................... 257/133
See application file for complete search history.

(56) References Cited

U.S. PATENT DOCUMENTS

| | | | | |
|---|---|---|---|---|
| 5,427,964 | A * | 6/1995 | Kaneshiro | ....... H01L 21/823807 257/E21.427 |
| 2011/0095368 | A1* | 4/2011 | Lee | ..................... H01L 27/0266 257/361 |
| 2012/0139037 | A1* | 6/2012 | Lin | ................... H01L 29/66666 257/330 |

* cited by examiner

*Primary Examiner* — Chuong A Luu
(74) *Attorney, Agent, or Firm* — Winston Hsu

(57) ABSTRACT

An ESD protection device includes a semiconductor substrate, a well, a gate structure, a first source/drain region, a second source/drain region, a first doped region, and a second doped region. The well is disposed in the semiconductor substrate. The gate structure is disposed on the well. The first source/drain region and the second source/drain region are disposed in the well and disposed at two opposite sides of the gate structure respectively. The first doped region is disposed in the first source/drain region. The second doped region is disposed in the second source/drain region. A conductivity type of the first doped region is complementary to that of the first source/drain region. A conductivity type of the second doped region is complementary to that of the second source/drain region. A conductivity type of the well is complementary to that of the first source/drain region and the second source/drain region.

12 Claims, 10 Drawing Sheets

ELECTROSTATIC DISCHARGE PROTECTION DEVICE AND MANUFACTURING METHOD THEREOF

BACKGROUND OF THE INVENTION

1. Field of the Invention

The present invention relates to an electrostatic discharge (ESD) protection device and a manufacturing method thereof, and more particularly, to an ESD protection device having a MOS structure and a manufacturing method thereof.

2. Description of the Prior Art

Chips and/or integrated circuits (ICs) are the most essential hardware foundation of the modern information field. As products based on ICs become more delicate, they also become more vulnerable to the impacts of the external environment. For example, it is found that electrostatic discharge (ESD) is a constant threat to modern electronics. The result of ESD on unprotected ICs is often destruction, characterized by melting or explosion of apart of the ICs. Therefore, the ESD protection devices are regarded as important components of the protection circuitry provided in electronic devices. Typically, during a normal IC operation, the ESD protection device is turned off. When an ESD event occurs, the ESD surges will cause the ESD protection device breakdown and create a substrate current path, through which the ESD current is diverted to ground and thus the core circuit is protected. There are some essential characteristics of the ESD protection device, such as low on resistance, low trigger voltage, and high withstanding voltage, and it is important to figure out effective approaches of improving the characteristics mentioned above for the related field.

SUMMARY OF THE INVENTION

It is one of the objectives of the present invention to provide an electrostatic discharge (ESD) protection device and a manufacturing method thereof. In the ESD protection device and the manufacturing method thereof in the present invention, doped regions are formed in a metal oxide semiconductor (MOS) structure for forming silicon control rectifier (SCR) configurations embedded in the MOS structure and the performance of the ESD protection device may be improved accordingly.

An ESD protection device is provided in an embodiment of the present invention. The ESD protection device includes a semiconductor substrate, a well, at least one gate structure, a first source/drain region, a second source/drain region, a first doped region, and a second doped region. The well is disposed in the semiconductor substrate. The gate structure is disposed on the semiconductor substrate, and the gate structure is disposed on the well. The first source/drain region and the second source/drain region are disposed in the well. The first source/drain region and the second source/drain are disposed at two opposite sides of the gate structure respectively. A conductivity type of the first source/drain region is identical to a conductivity type of the second source/drain region, and a conductivity type of the well is complementary to the conductivity type of the first source/drain region and the conductivity type of the second source/drain region. The first doped region is disposed in the first source/drain region, and the second doped region is disposed in the second source/drain region. The first doped region is electrically connected with the first source/drain region, and a conductivity type of the first doped region is complementary to the conductivity type of the first source/drain region. The second doped region is electrically connected with the second source/drain region, and a conductivity type of the second doped region is complementary to the conductivity type of the second source/drain region.

A manufacturing method of an ESD protection device is provided in an embodiment of the present invention. The manufacturing method includes the following steps. A semiconductor substrate is provided. A well is formed in the semiconductor substrate. At least one gate structure is formed on the semiconductor substrate, and the at least one gate structure is formed on the well. A first source/drain region and a second source/drain region are formed in the well. The first source/drain region and the second source/drain are formed at two opposite sides of the gate structure respectively. A conductivity type of the first source/drain region is identical to a conductivity type of the second source/drain region, and a conductivity type of the well is complementary to the conductivity type of the first source/drain region and the conductivity type of the second source/drain region. A first doped region is formed in the well. The first source/drain region surrounds the first doped region, and the first doped region is electrically connected with the first source/drain region. A conductivity type of the first doped region is complementary to the conductivity type of the first source/drain region. A second doped region is formed in the well. The second source/drain region surrounds the second doped region, and the second doped region is electrically connected with the second source/drain region. A conductivity type of the second doped region is complementary to the conductivity type of the second source/drain region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
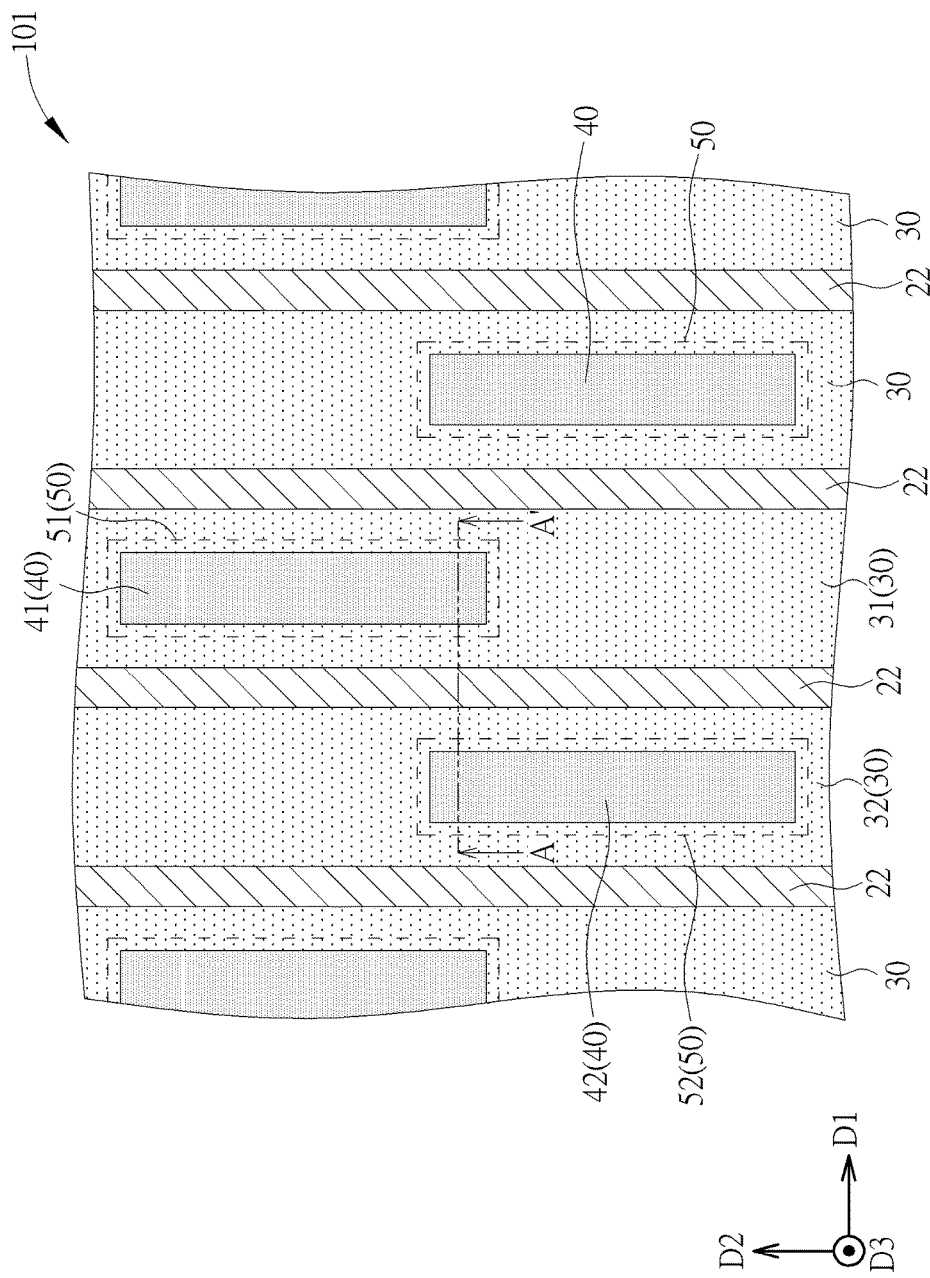
FIG. 1 is a schematic top view diagram illustrating an electrostatic discharge (ESD) protection device according to a first embodiment of the present invention.
Figure 2:
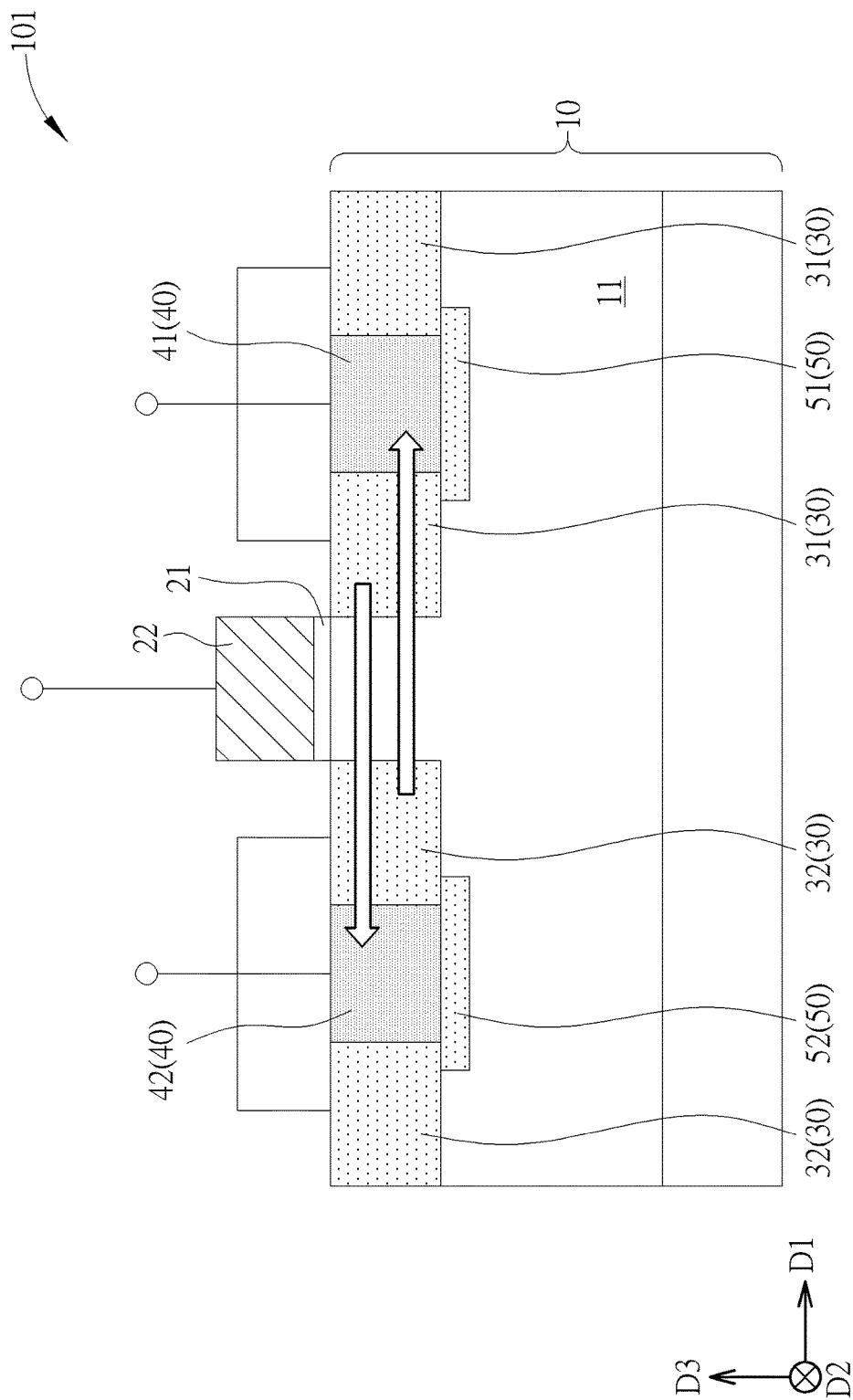
FIG. 2 is a cross-sectional drawing taken along a line A-A' in FIG. 1.

Please refer to FIG. 1 and FIG. 2. FIG. 1 is a schematic top view diagram illustrating an electrostatic discharge (ESD) protection device according to a first embodiment of the present invention. FIG. 2 is a cross-sectional drawing taken along a line A-A' in FIG. 1. As shown in FIG. 1 and FIG. 2, an ESD protection device 101 is provided. The ESD protection device 101 includes a semiconductor substrate 10, a well 11, at least one gate structure 22, a first source/drain region 31, a second source/drain region 32, a first doped region 41, and a second doped region 42. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The well 11 is disposed in the semiconductor substrate 10. The well may include an N-type well or a P-type well. The gate structure 22 is disposed on the semiconductor substrate 10, and the gate structure 22 is disposed on the well 11. The gate structure 22 may include polysilicon, metals, or other appropriate conductive materials. A gate dielectric layer 21 may be formed between the gate structure 22 and the well 11, and the gate dielectric layer 21 may include silicon oxide, high dielectric constant dielectric materials, or other suitable dielectric materials. The first source/drain region 31 and the second source/drain region 32 are disposed in the well 11, and the first source/drain region 31 and the second source/drain 32 are disposed at two opposite sides of the gate structure 22 in a first direction D1 respectively. The first source/drain region 31 and the second source/drain 32 may include doped regions formed in the well 11. A conductivity type of the first source/drain region 31 is identical to a conductivity type of the second source/drain region 32, and a conductivity type of the well 11 is complementary to the conductivity type of the first source/drain region 31 and the conductivity type of the second source/drain region 32. For example, when the well 11 is an N-type well, the first source/drain region 31 and the second source/drain region 32 may be a P-type doped region respectively, and the ESD protection device 101 may be regarded as a PMOS structure, but the present invention is not limited to this. In some embodiments, the first source/drain region 31 and the second source/drain region 32 may be an N-type doped region respectively, the well 11 may be a P-type well, and the ESD protection device 101 may be regarded as a NMOS structure. The first doped region 41 is disposed in the first source/drain region 31, and the second doped region 42 is disposed in the second source/drain region 32. The first doped region 41 is electrically connected with the first source/drain region 31, and a conductivity type of the first doped region 41 is complementary to the conductivity type of the first source/drain region 31. The second doped region 42 is electrically connected with the second source/drain region 32, and a conductivity type of the second doped region 42 is complementary to the conductivity type of the second source/drain region 32. For example, the first doped region 41 and the second doped region 42 may be an N-type doped region respectively when the first source/drain region 31 and the second source/drain region 32 are P-type doped regions, and the first doped region 41 and the second doped region 42 may be a P-type doped region respectively when the first source/drain region 31 and the second source/drain region 32 are N-type doped regions.

In some embodiment, the first source/drain region 31 may surround the first doped region 41 in a horizontal direction, such as the first direction D1 and a second direction D2 shown in FIG. 1 and FIG. 2, and the second source/drain region 32 may surround the second doped region 42 in the horizontal direction, but not limited thereto. In some embodiments, the first source/drain region 31 may directly contact the first doped region 41, the second source/drain region 32 may directly contact the second doped region 42, and a part of the well 11 may be disposed between the first source/drain region 31 and the second source/drain region 32 in the first direction D1 and directly contact the first source/drain region 31 and the second source/drain region 32. In some embodiments, the first source/drain region 31 and the first doped region 41 may be electrically connected to a terminal, and the second source/drain region 32 and the second doped region 42 are electrically connected to another terminal. In other words, an electrical potential of the first source/drain region 31 is equal to an electrical potential of the first doped region 41, and an electrical potential of the second source/drain region 32 is equal to an electrical potential of the second doped region 42. The terminals may be connected to I/O respectively, or one of the terminals may be connected to ground. For example, when the first source/drain region 31 is connected to I/O, the second source/drain region 32 is connected to ground, and a positive ESD transient comes to I/O against ground, an electric current may pass through the first source/drain region 31, the well 11, the second source/drain region 32, and the second doped region 42 sequentially (such as an arrow pointing leftwards in FIG. 2). The first source/drain region 31, the well 11, the second source/drain region 32, and the second doped region 42 may be regarded as a silicon control rectifier (SCR) configuration embedded in the MOS structure. When the first source/drain region 31 is connected to I/O, the second source/drain region 32 is connected to ground, and a negative ESD transient comes to I/O against ground, an electric current may pass through the second source/drain region 32, the well 11, the first source/drain region 31, and the first doped region 41 sequentially (such as an arrow pointing rightwards in FIG. 2). The second source/drain region 32, the well 11, the first source/drain region 31, and the first doped region 41 may be regarded as another SCR configuration embedded in the MOS structure. Accordingly, the ESD protection device 101 may be capable of providing bi-directional ESD protection, but not limited thereto. The embedded SCR may be used to reduce on resistance of the ESD protection device 101 and increasing the second breakdown current ($I_{t2}$) of the ESD protection device 101.

In addition, the ESD protection device 101 may further include a third doped region 51 and a fourth doped region 52. The third doped region 51 and the fourth doped region 52 are disposed in the well 11. The third doped region 51 is disposed under the first doped region 41, the third doped region 51 is electrically connected with the first doped region 41, and a conductivity type of the third doped region 51 is complementary to the conductivity type of the first doped region 41. The fourth doped region 52 is disposed under the second doped region 42, the fourth doped region 52 is electrically connected with the second doped region 42, and a conductivity type of the fourth doped region 52 is complementary to the conductivity type of the second doped region 42. For example, the third doped region 51 and the fourth doped region 52 may be a P-type doped region respectively when the first doped region 41 and the second doped region 42 are N-type doped regions, but not limited thereto. In some embodiments, the third doped region 51 and the fourth doped region 52 may also be an N-type doped region respectively when the first doped region 41 and the second doped region 42 are P-type doped regions. The third doped region 51 may directly contact the first doped region 41, and the fourth doped region 52 may directly contact the second doped region 42. In some embodiments, the third doped region 51 may be further disposed under the first source/drain region 31 in a vertical direction D3, and the fourth doped region 52 may be further disposed under the second source/drain region 32 in the vertical direction D3. The third doped region 51 may directly contact the first source/drain region 31 and the first doped region 41, and the fourth doped region 52 may directly contact the second source/drain region 32 and the second doped region 42. In other words, the first doped region 41 may be fully compassed by the first source/drain region 31 and the third doped region 51 except the top surface of the first doped region 41, and the second doped region 42 may be fully compassed by the second source/drain region 32 and the fourth doped region 52 except the top surface of the second doped region 42. In some embodiments, the ESD protection device 101 may include a planar MOS structure, and/or a non-planar MOS structure, such as a fin type field effect transistor (FinFET) or a gate-all-around (GAA) nanowire FET. The FinFET mentioned above may include a dual-gate FinFET, a tri-gate FinFET, or an omega FinFET. In other words, the structure of the ESD protection device in the present invention may be applied with planar MOS design and/or non-planar MOS design.

As shown in FIG. 1 and FIG. 2, in some embodiments, the gate structure 22, the first doped region 41, and the second doped region 42 may extend in the second direction D2 respectively, and the second direction D2 may be orthogonal to the first direction D1, but not limited thereto. The first doped region 41 may partially overlap the second doped region 42 along the second direction D2 in a top view of the ESD protection device 101, but not limited thereto. In some embodiments, the ESD protection device 101 may include a plurality of the gate structures 22, a plurality of source/drain regions 30, a plurality of first type doped regions 40, and a plurality of second type doped regions 50. The source/drain regions 30 are disposed at two opposite sides of each gate structure 22 respectively. The first source/drain region 31 and the second source/drain region 32 mentioned above may be one of the source/drain regions 30 respectively. Each of the first type doped regions 40 is disposed in one of the source/drain regions 30. The first doped region 41 and the second doped region 42 mentioned above may be one of the first type doped regions 40 respectively. Each of the second type doped regions 50 is disposed under one of the first type doped regions 40 in the vertical direction D3. The third doped region 51 and the fourth doped region 52 mentioned above may be one of the second type doped regions 50 respectively.

Figure 3:
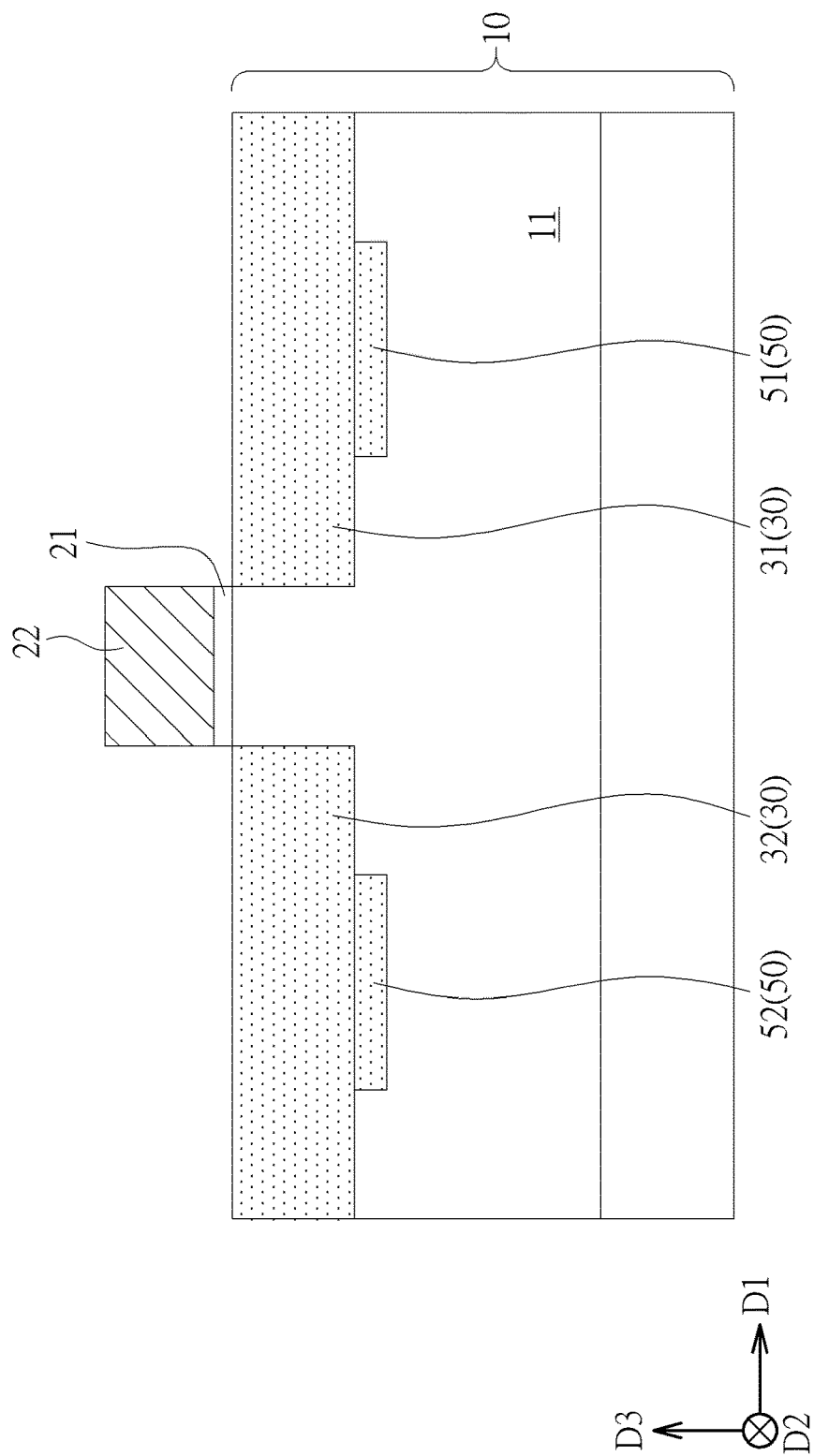
FIG. 3 is a schematic drawing illustrating a manufacturing method of the ESD protection device according to an embodiment of the present invention.

Please refer to FIGS. 1-3. FIG. 3 is a schematic drawing illustrating a manufacturing method of the ESD protection device 101 according to an embodiment of the present invention, and FIG. 2 may be regarded as a schematic drawing in a step subsequent to FIG. 3. As shown in FIGS. 1-3, the manufacturing method of the ESD protection device 101 may include but is not limited to the following steps. The semiconductor substrate 10 is provided. The well 11 is formed in the semiconductor substrate 10. At least one gate structure 22 is formed on the semiconductor substrate 10, and the at least one gate structure 22 is formed on the well 11. The first source/drain region 31 and the second source/drain region 32 are formed in the well 11 and formed at two opposite sides of the gate structure 22 respectively. The conductivity type of the first source/drain region 31 is identical to a conductivity type of the second source/drain region 32, and a conductivity type of the well 11 is complementary to the conductivity type of the first source/drain region 31 and the conductivity type of the second source/drain region 32. The first doped region 41 is formed in the well 11. The first source/drain region 31 surrounds the first doped region 41, and the first doped region 41 is electrically connected with the first source/drain region 31. A conductivity type of the first doped region 41 is complementary to the conductivity type of the first source/drain region 31. The second doped region 42 is formed in the well 11. The second source/drain region 32 surrounds the second doped region 42, and the second doped region 42 is electrically connected with the second source/drain region 32. A conductivity type of the second doped region is complementary to the conductivity type of the second source/drain region 32.

As shown in FIG. 3, the first source/drain region 31 and the second source/drain region 32 may be formed in the well 11 before the step of forming the first doped region and the second doped region. In other words, as shown in FIG. 3 and FIG. 2, the first doped region 41 and the second doped region 42 are formed after the step of forming the first source/drain region 31 and the second source/drain region 32, the first doped region 41 may be formed in the first source/drain region 31, and the second doped region 42 may be formed in the second source/drain region 32 by processes such as an implantation process performed to the first source/drain region 31 and the second source/drain region 32, but not limited thereto. In addition, the third doped region 51 and the fourth doped region 52 are formed in the well 11, and the third doped region 51 and the fourth doped region 52 may also be formed before the step of forming the first doped region 41 and the second doped region 42, but not limited thereto.

Figure 4:
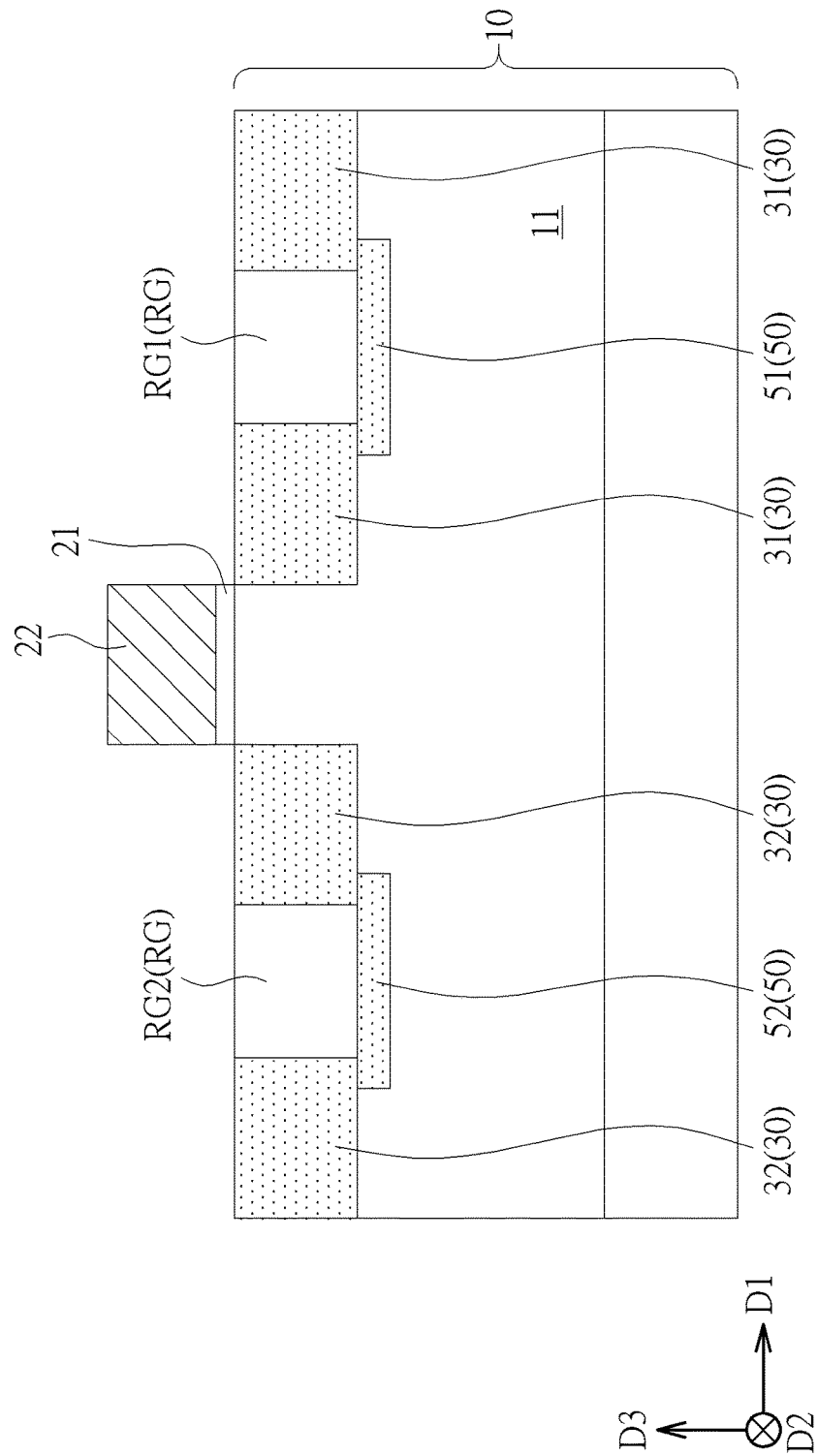
FIG. 4 is a schematic drawing illustrating a manufacturing method of the ESD protection device according to another embodiment of the present invention.

Please refer to FIG. 1, FIG. 2, and FIG. 4. FIG. 4 is a schematic drawing illustrating a manufacturing method of the ESD protection device 101 according to another embodiment of the present invention, and FIG. 2 may be regarded as a schematic drawing in a step subsequent to FIG. 4. As shown in FIG. 1, FIG. 2, and FIG. 4, in some embodiment, the first doped region 41 and the second doped region 42 are formed after the step of forming the source/drain regions 30, the first doped region 41 is formed in a part of the well 11 surrounded by the first source/drain region 31, and the second doped region 42 is formed in a part of the well 11 surrounded by the second source/drain region 32. In other words, a region RG of the well 11 is surrounded by each of the source/drain regions 30 before the step of forming the first doped region 41 and the second doped region 42. For example, a first region RG1 of the well 11 is surrounded by the first source/drain region 31, and the second region RG2 of the well 11 is surrounded by the second source/drain region 32. The first doped region 41 may be at least partially formed in the first region RG1 and the second doped region 42 may be at least partially formed in the second region RG2 by processes such as an implantation process performed to the first region RG1 and the second region RG2 of the well 11, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
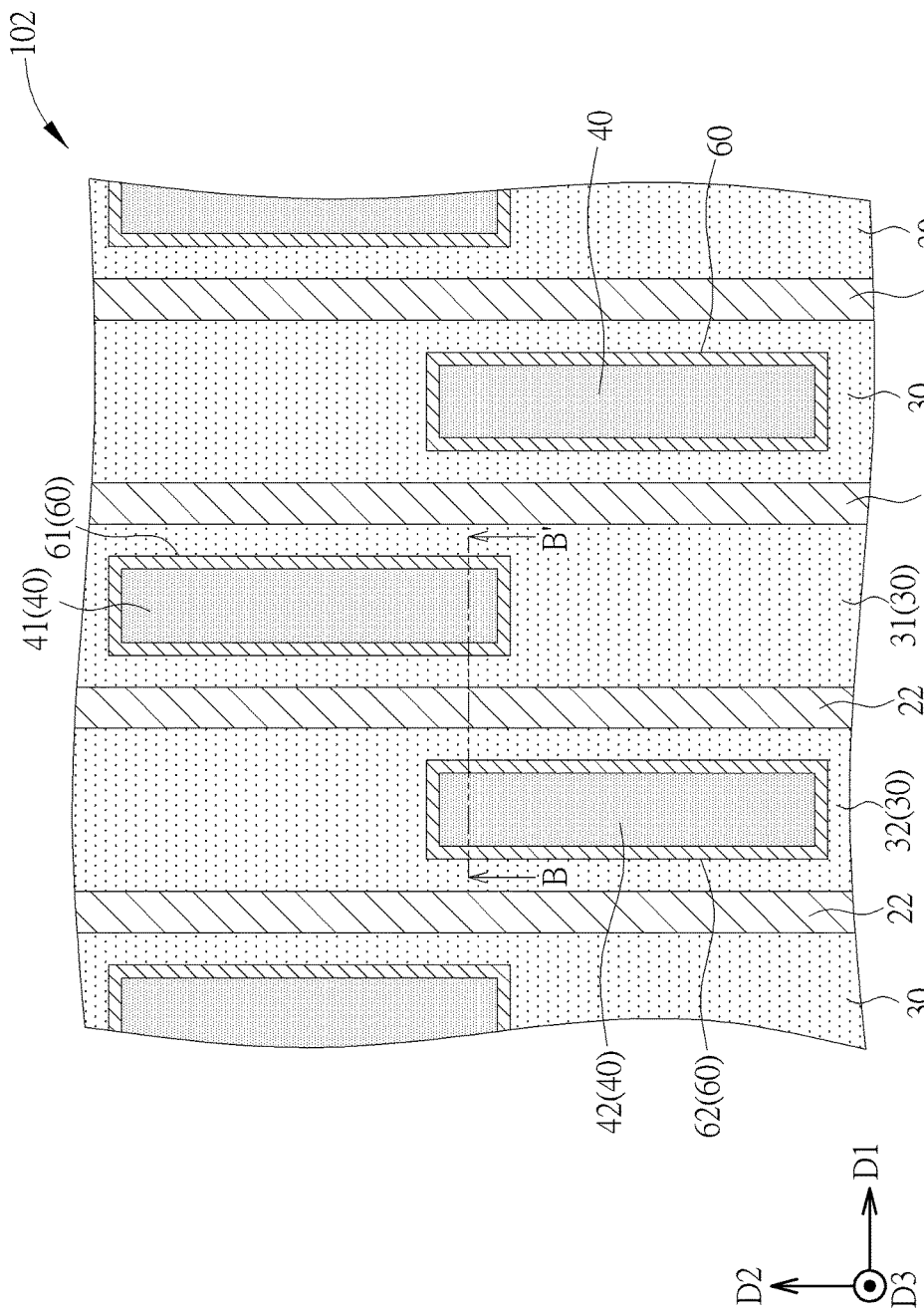
FIG. 5 is a schematic top view diagram illustrating an ESD protection device according to a second embodiment of the present invention.
Figure 6:
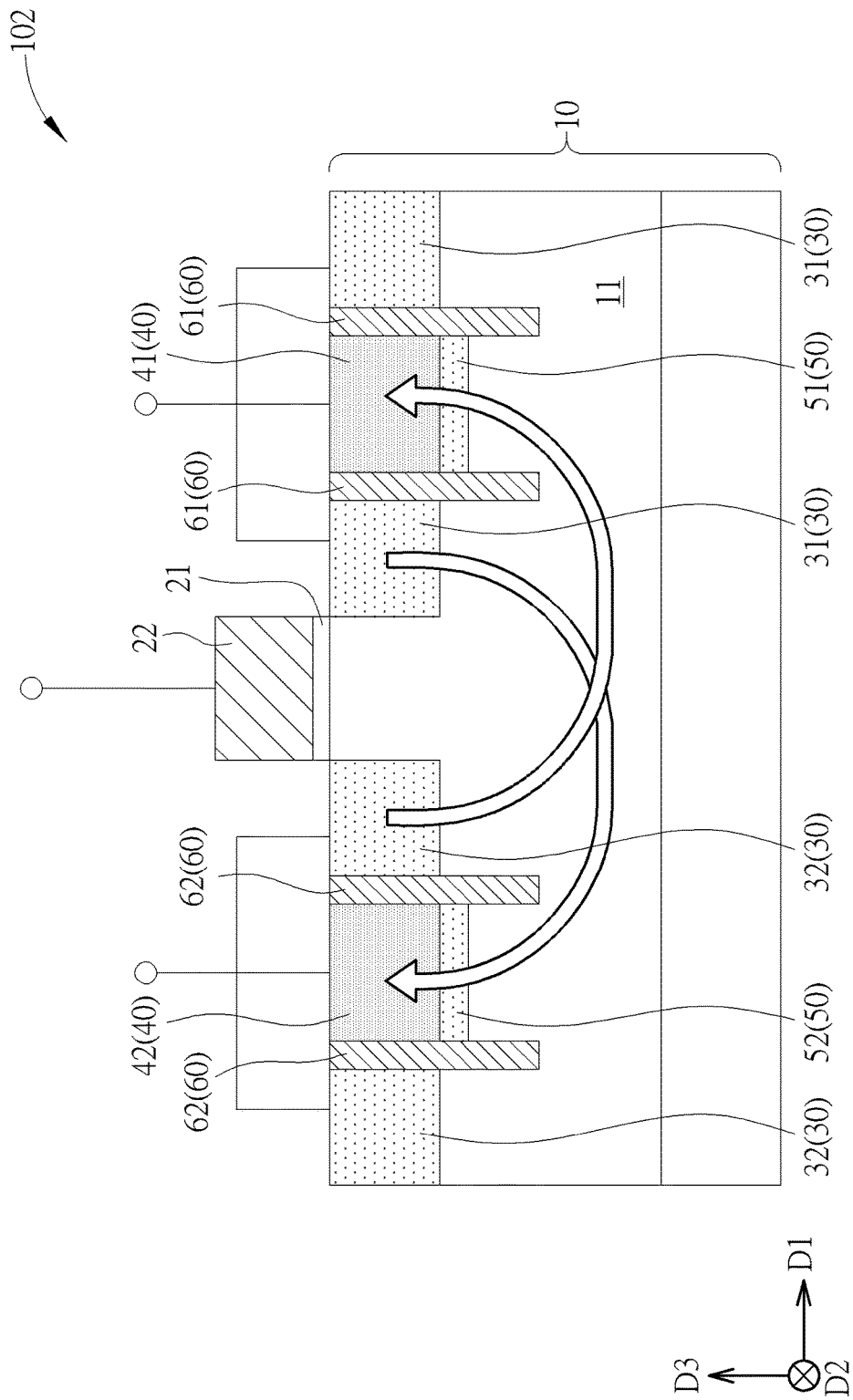
FIG. 6 is a cross-sectional drawing taken along a line B-B' in FIG. 5.

Please refer to FIG. 5 and FIG. 6. FIG. 5 is a schematic top view diagram illustrating an ESD protection device 102 according to a second embodiment of the present invention. FIG. 6 is a cross-sectional drawing taken along a line B-B' in FIG. 5. As shown in FIG. 5 and FIG. 6, the difference between the ESD protection device 102 and the ESD protection device in the first embodiment is that the ESD protection device 102 may further include a plurality of isolation structures 60 disposed in the semiconductor substrate 10. Each of the isolation structures 60 surrounds one of the first type doped regions 40 for separating the first type doped regions 40 from the source/drain regions 30. For example, the isolation structures 60 may include a first isolation structure 61 and a second isolation structure 62. The first isolation structure 61 is disposed in the first source/drain region 31 and the well 11, and the second isolation structure 62 is disposed in the second source/drain region 32 and the well 11. In other words, an upper part of each of the isolation structures 60 penetrates the corresponding source/drain region 30 in the vertical direction D3, and a lower part of each of the isolation structures 60 is disposed in the well 11. In some embodiments, the first isolation structure 61 surrounds the first doped region 41 in the horizontal direction, and the first doped region 41 is separated from the first source/drain region 31 by the first isolation structure 61. The second isolation structure 62 surrounds the second doped region 42 in the horizontal direction, and the second doped region 42 is separated from the second source/drain region 32 by the second isolation structure 62. Additionally, the first isolation structure 61 further surrounds the third doped region 51, and the second isolation structure 62 further surrounds the fourth doped region 52. Therefore, the third doped region 51 is separated from the first source/drain region 31 by the first isolation structure 61, and the fourth doped region 52 is separated from the second source/drain region 32 by the second isolation structure 62. In other words, a bottommost part of each of the isolation structures 60 may be lower than the source/drain regions 30 in the vertical direction D3 for separating the source/drain regions 30 from the first type doped regions 40 and the second type doped regions 50.

In the ESD protection device 102 of this embodiment, when the first source/drain region 31 is connected to I/O, the second source/drain region 32 is connected to ground, and a positive ESD transient comes to I/O against ground, an electric current may pass through the first source/drain region 31, the well 11, the fourth doped region 52, and the second doped region 42 sequentially (such as an arrow pointing towards the second doped region 42 in FIG. 6). The first source/drain region 31, the well 11, the fourth doped region 52, and the second doped region 42 may be regarded as a SCR embedded in the MOS structure. When the first source/drain region 31 is connected to I/O, the second source/drain region 32 is connected to ground, and a negative ESD transient comes to I/O against ground, an electric current may pass through the second source/drain region 32, the well 11, the third doped region 51, and the first doped region 41 sequentially (such as an arrow pointing towards the first doped region 41 in FIG. 6). The second source/drain region 32, the well 11, the third doped region 51, and the first doped region 41 may be regarded as another SCR embedded in the MOS structure. By forming the first isolation structure 61 in the first source/drain region 31 and the well 11 and forming the second isolation structure 62 in the second source/drain region 32 and the well 11, the source/drain regions 30 will not be directly contact the corresponding first type doped regions 40, and the interferences between the source/drain regions 30 and the corresponding first type doped regions 40 may be reduced. The trigger voltage of the ESD protection device 102 may be lowered and the turn-on speed of the ESD protection device 102 may be enhanced accordingly. Additionally, the isolation structures 60 may include insulation materials such as silicon oxide, silicon nitride, silicon oxynitride, or other suitable insulation materials. The manufacturing method of the isolation structures 60 may be integrated with a manufacturing method of shallow trench isolations (not shown), but not limited thereto.

Figure 7:
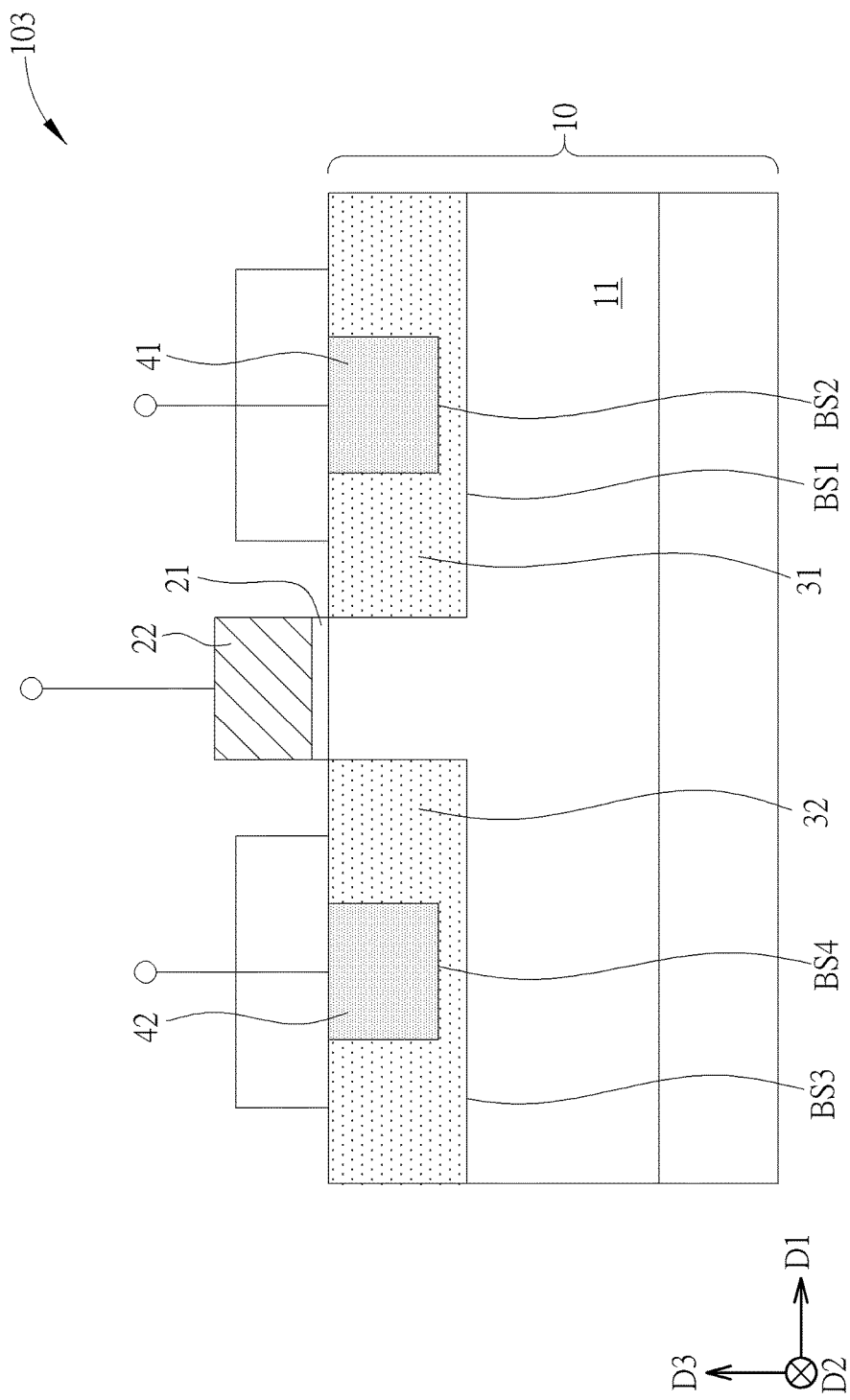
FIG. 7 is a schematic diagram illustrating an ESD protection device according to a third embodiment of the present invention.

Please refer to FIG. 7. FIG. 7 is a schematic diagram illustrating an ESD protection device 103 according to a third embodiment of the present invention. As shown in FIG. 7, the difference between the ESD protection device 103 and the ESD protection device in the first embodiment is that the second type doped regions mentioned in the first embodiment is not disposed in the ESD protection device 103. In this embodiment, the first doped region 41 is fully compassed by the first source/drain region 31 except the top surface of the first doped region 41, and the second doped region 42 is fully compassed by the second source/drain region 32 except the top surface of the second doped region 42. Apart of the first source/drain region 31 is disposed under the first doped region 41 in the vertical direction D3, and a part of the second source/drain region 32 is disposed under the second doped region 42. In other words, a bottom surface BS1 of the first source/drain region 31 is lower than a bottom surface BS2 of the first doped region 41 in the vertical direction D3, and a bottom surface BS3 of the second source/drain region 32 is lower than a bottom surface BS4 of the second doped region 42 in the vertical direction D3.

Figure 8:
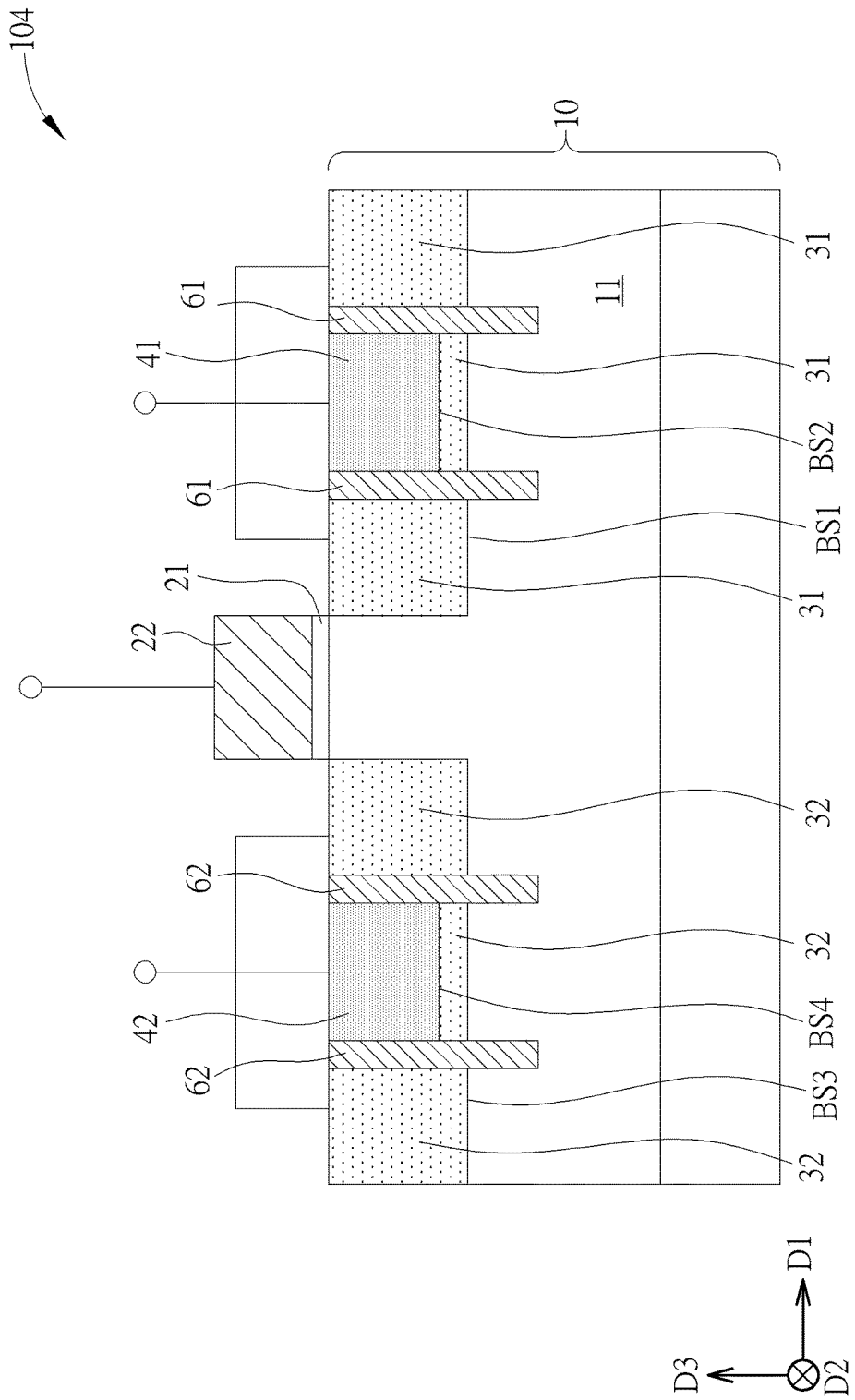
FIG. 8 is a schematic diagram illustrating an ESD protection device according to a fourth embodiment of the present invention.

Please refer to FIG. 8. FIG. 8 is a schematic diagram illustrating an ESD protection device 104 according to a fourth embodiment of the present invention. As shown in FIG. 8, the difference between the ESD protection device 104 and the ESD protection device in the third embodiment is that the ESD protection device 104 further includes the first isolation structure 61 and the second isolation structure 62. The first isolation structure 61 is disposed in the first source/drain region 31 and the well 11, and the second isolation structure 62 is disposed in the second source/drain region 32 and the well 11. The first isolation structure 61 penetrates the first source/drain region 31 in the vertical direction D3, and the second isolation structure 62 penetrates the second source/drain region 32 in the vertical direction D3. The first isolation structure 61 surrounds the first doped region 41, and a part of the first isolation structure 62 is disposed between the first doped region 41 and the first source/drain region 31. The second isolation structure 62 surrounds the second doped region 42, and a part of the second isolation structure 62 is disposed between the second doped region 42 and the second source/drain region 32. In some embodiments, the first isolation structure 61 may further surround a part of the first source/drain region 31 disposed under the first doped region 41 in the vertical direction D3, and the second isolation structure 62 may further surround a part of the second source/drain region 32 disposed under the second doped region 42 in the vertical direction D3. The part of the first source/drain region 31 disposed under the first doped region 41 and surrounded by the first isolation structure 61 may be used as the third doped region in the second embodiment mentioned above, and the part of the second source/drain region 32 disposed under the second doped region 42 and surrounded by the second isolation structure 62 may be used as the fourth doped region in the second embodiment mentioned above.

Figure 9:
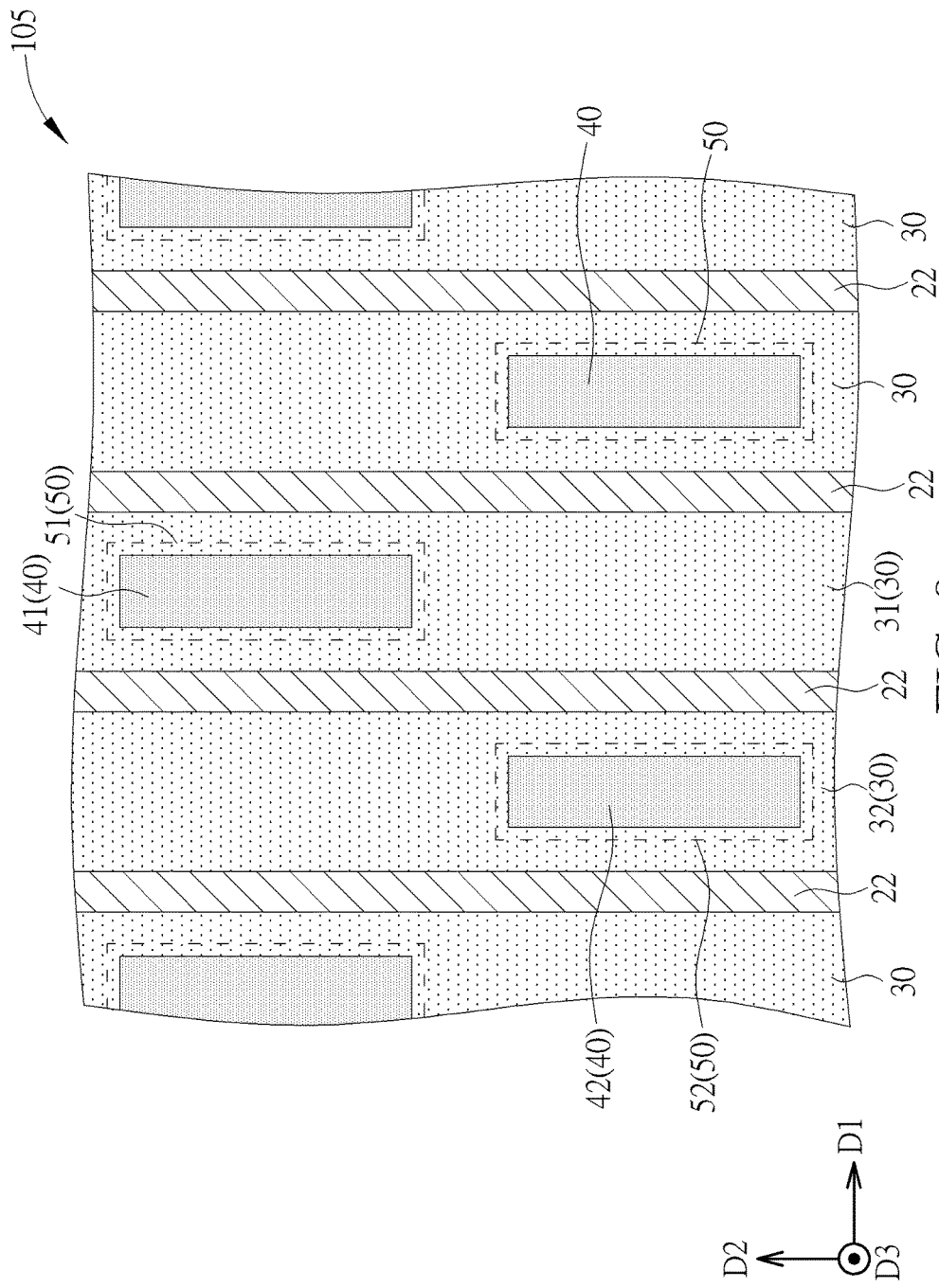
FIG. 9 is a schematic diagram illustrating an ESD protection device according to a fifth embodiment of the present invention.

Please refer to FIG. 9. FIG. 9 is a schematic diagram illustrating an ESD protection device 105 according to a fifth embodiment of the present invention. As shown in FIG. 9, the difference between the ESD protection device 105 and the ESD protection device in the first embodiment is that the first doped region 41 does not overlap the second doped region 42 along the second direction D2. In other words, two of the first type doped regions 40 disposed adjacent to each other in the first direction D1 may not overlap each other along the second direction D2 perpendicular to the first direction D1 in a top view of the ESD protection device 105. The allocation of the first type doped regions 40 may also be applied to at least some of the embodiments mentioned above.

Figure 10:
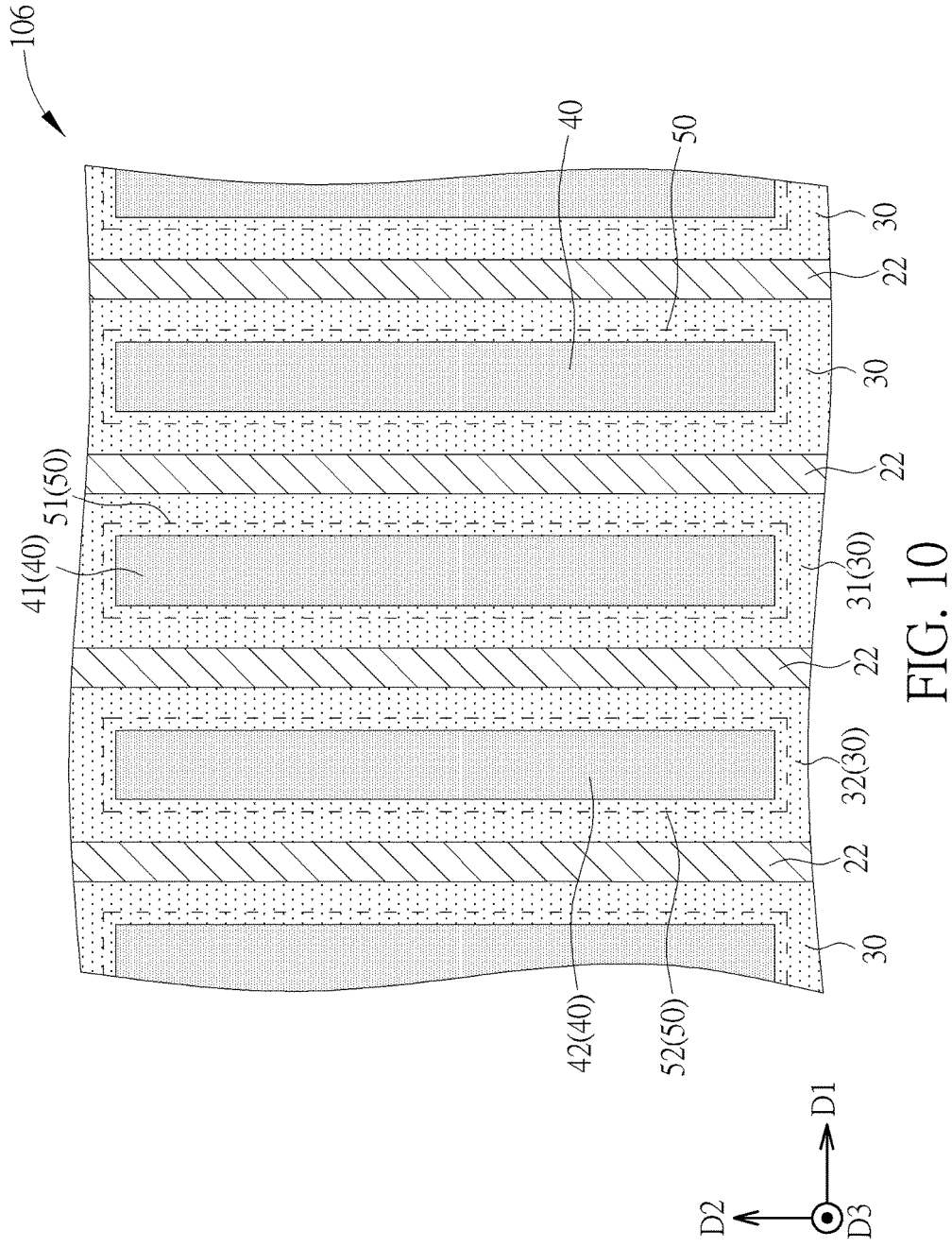
FIG. 10 is a schematic diagram illustrating an ESD protection device according to a sixth embodiment of the present invention.

Please refer to FIG. 10. FIG. 10 is a schematic diagram illustrating an ESD protection device 106 according to a sixth embodiment of the present invention. As shown in FIG. 10, the difference between the ESD protection device 106 and the ESD protection device in the first embodiment is that the first doped region 41 may fully overlap the second doped region 42 along the second direction D2. In other words, the first type doped regions 40 disposed adjacent to one another in the first direction D1 may fully overlap one another along the second direction D2 in a top view of the ESD protection device 106. Additionally, the allocation of the first type doped regions 40 in this embodiment may also be applied to at least some of the embodiments mentioned above.

To summarize the above descriptions, in the ESD protection device and the manufacturing method thereof in the present invention, the first type doped regions are formed in the source/drain regions of the MOS structure for forming SCR configurations embedded in the MOS structure. The SCRs in the ESD protection device may be used to enhance the ESD protection performance and provide bi-directional ESD protections.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, comprising:
   a semiconductor substrate;
   a well disposed in the semiconductor substrate;
   at least one gate structure disposed on the semiconductor substrate, wherein the at least one gate structure is disposed on the well;
   a first source/drain region and a second source/drain region disposed in the well, wherein the first source/drain region and the second source/drain are disposed at two opposite sides of the gate structure respectively, a conductivity type of the first source/drain region is identical to a conductivity type of the second source/drain region, and a conductivity type of the well is complementary to the conductivity type of the first source/drain region and the conductivity type of the second source/drain region;
   a first doped region disposed in the first source/drain region, wherein the first doped region is electrically connected with the first source/drain region, and a conductivity type of the first doped region is complementary to the conductivity type of the first source/drain region; and
   a second doped region disposed in the second source/drain region, wherein the second doped region is electrically connected with the second source/drain region, and a conductivity type of the second doped region is complementary to the conductivity type of the second source/drain region, wherein the first source/drain region completely surrounds the first doped region, and the second source/drain region completely surrounds the second doped region.

2. The ESD protection device of claim 1, wherein the first source/drain region directly contacts the first doped region, and the second source/drain region directly contacts the second doped region.

3. The ESD protection device of claim 1, further comprising:
   a third doped region disposed in the well, wherein the third doped region is disposed under the first doped region, the third doped region is electrically connected with the first doped region, and a conductivity type of the third doped region is complementary to the conductivity type of the first doped region; and
   a fourth doped region disposed in the well, wherein the fourth doped region is disposed under the second doped region, the fourth doped region is electrically connected with the second doped region, and a conductivity type of the fourth doped region is complementary to the conductivity type of the second doped region.

4. The ESD protection device of claim 3, wherein the third doped region directly contacts the first doped region, and the fourth doped region directly contacts the second doped region.

5. The ESD protection device of claim 3, wherein the third doped region is further disposed under the first source/drain region, and the fourth doped region is further disposed under the second source/drain region, wherein the third doped region directly contacts the first source/drain region and the first doped region, and the fourth doped region directly contacts the second source/drain region and the second doped region.

6. The ESD protection device of claim 3, further comprising:
   a first isolation structure disposed in the first source/drain region and the well, wherein the first isolation structure surrounds the first doped region, and the first doped region is separated from the first source/drain region by the first isolation structure; and
   a second isolation structure disposed in the second source/drain region and the well, wherein the second isolation structure surrounds the second doped region, and the second doped region is separated from the second source/drain region by the second isolation structure.

7. The ESD protection device of claim 6, wherein the first isolation structure further surrounds the third doped region, and the second isolation structure further surrounds the fourth doped region.

8. The ESD protection device of claim 1, wherein the first doped region is fully compassed by the first source/drain region, and the second doped region is fully compassed by the second source/drain region.

9. The ESD protection device of claim 8, wherein a part of the first source/drain region is disposed under the first doped region, and a part of the second source/drain region is disposed under the second doped region.

10. The ESD protection device of claim 8, further comprising:
- a first isolation structure disposed in the first source/drain region and the well, wherein the first isolation structure surrounds the first doped region, and a part of the first isolation structure is disposed between the first doped region and the first source/drain region; and
- a second isolation structure disposed in the second source/drain region and the well, wherein the second isolation structure surrounds the second doped region, and a part of the second isolation structure is disposed between the second doped region and the second source/drain region.

11. The ESD protection device of claim 10, wherein the first isolation structure further surrounds a part of the first source/drain region disposed under the first doped region, and the second isolation structure further surrounds a part of the second source/drain region disposed under the second doped region.

12. The ESD protection device of claim 1, wherein an electrical potential of the first source/drain region is equal to an electrical potential of the first doped region, and an electrical potential of the second source/drain region is equal to an electrical potential of the second doped region.

* * * * *